United States Patent
Ozawa et al.

(10) Patent No.: US 8,022,604 B2
(45) Date of Patent: Sep. 20, 2011

(54) (LI, NA, K)(NB, TA)O3 TYPE PIEZOELECTRIC/ELECTROSTRICTIVE CERAMIC COMPOSITION CONTAINING 30-50 MOL% TA AND PIEZOELECTRIC/ELECTRORESTRICTIVE DEVICE CONTAINING THE SAME

(75) Inventors: Shuichi Ozawa, Aichi (JP); Hirofumi Yamaguchi, Aichi (JP)

(73) Assignee: NGK Insulators, Ltd., Nagoya (JP)

( * ) Notice: Subject to any disclaimer, the term of this patent is extended or adjusted under 35 U.S.C. 154(b) by 182 days.

(21) Appl. No.: 12/251,523

(22) Filed: Oct. 15, 2008

(65) Prior Publication Data
US 2009/0102325 A1    Apr. 23, 2009

(30) Foreign Application Priority Data

Oct. 19, 2007 (JP) .................................. 2007-272082
Sep. 12, 2008 (JP) .................................. 2008-234585

(51) Int. Cl.
  *H01L 41/187* (2006.01)
(52) U.S. Cl. ............ 310/358; 252/62.9 PZ; 252/62.9 R; 310/328
(58) Field of Classification Search .................. 310/358; 501/134; 252/62.9 R
See application file for complete search history.

(56) References Cited

U.S. PATENT DOCUMENTS

| | | | | |
|---|---|---|---|---|
| 6,083,415 A | * | 7/2000 | Kimura et al. | 252/62.9 R |
| 6,093,339 A | * | 7/2000 | Kimura et al. | 252/62.9 R |
| 6,404,102 B1 | * | 6/2002 | Suzuki et al. | 310/320 |
| 6,514,427 B2 | * | 2/2003 | Nishida et al. | 252/62.9 R |
| 6,579,468 B2 | * | 6/2003 | Kimura et al. | 252/62.9 R |
| 7,101,491 B2 | * | 9/2006 | Nonoyama et al. | 252/62.9 R |
| 7,150,838 B2 | * | 12/2006 | Nonoyama et al. | 252/62.9 R |
| 7,267,783 B2 | * | 9/2007 | Nonoyama et al. | 252/62.9 R |
| 7,309,450 B2 | * | 12/2007 | Nanao et al. | 252/62.9 R |
| 7,477,004 B2 | * | 1/2009 | Nanataki et al. | 310/358 |
| 7,482,736 B2 | * | 1/2009 | Ueno et al. | 310/358 |
| 7,494,601 B2 | * | 2/2009 | Wang et al. | 252/62.9 R |

(Continued)

FOREIGN PATENT DOCUMENTS

WO     2006/095716 A1     9/2006

OTHER PUBLICATIONS

Saito, Yasuyoshi, et al., "High Performance Lead-free Piezoelectric Ceramics in the (K, Na)NbO$_3$,-LiTaO$_3$ Solid Solution System". *Ferroelectrics*. 338: pp. 17-32 (2006).

*Primary Examiner* — Jaydi San Martin
(74) *Attorney, Agent, or Firm* — Burr & Brown

(57) ABSTRACT

The invention provides a (Li, Na, K)(Nb, Ta)O$_3$ type piezoelectric/electrostrictive ceramic composition capable of being sintered at a low temperature and providing good electric field-induced strain at the time of high electric field application at a temperature for practical use. The piezoelectric/electrostrictive ceramic composition has an ABO$_3$ type composition formula wherein lithium, sodium, and potassium are contained as first elements; niobium and tantalum are contained as second elements; oxygen (O) is contained as a third element; A/B ratio is higher than 1; and the ratio of the number of Ta atoms to the total number of atoms of the second elements is 10 mol % or more and 50 mol % or less, and comprises a perovskite type oxide wherein the first elements are A site composing elements and the second elements are B site composing elements.

2 Claims, 6 Drawing Sheets

U.S. PATENT DOCUMENTS

| | | | |
|---|---|---|---|
| 7,531,947 B2 * | 5/2009 | Shindo et al. | 310/363 |
| 7,691,286 B2 * | 4/2010 | Kawada et al. | 252/62.9 R |
| 7,710,003 B2 * | 5/2010 | Shibata et al. | 310/358 |
| 2006/0202170 A1 | 9/2006 | Koizumi et al. | |
| 2008/0152581 A1 * | 6/2008 | Kaigawa et al. | 423/594.8 |
| 2008/0302996 A1 * | 12/2008 | Yura et al. | 252/62.9 R |
| 2009/0091214 A1 * | 4/2009 | Ozawa et al. | 310/358 |
| 2009/0189489 A1 * | 7/2009 | Yura et al. | 310/358 |
| 2009/0236556 A1 * | 9/2009 | Tanaka et al. | 252/62.9 R |
| 2010/0022381 A1 * | 1/2010 | Tanaka et al. | 501/134 |

* cited by examiner

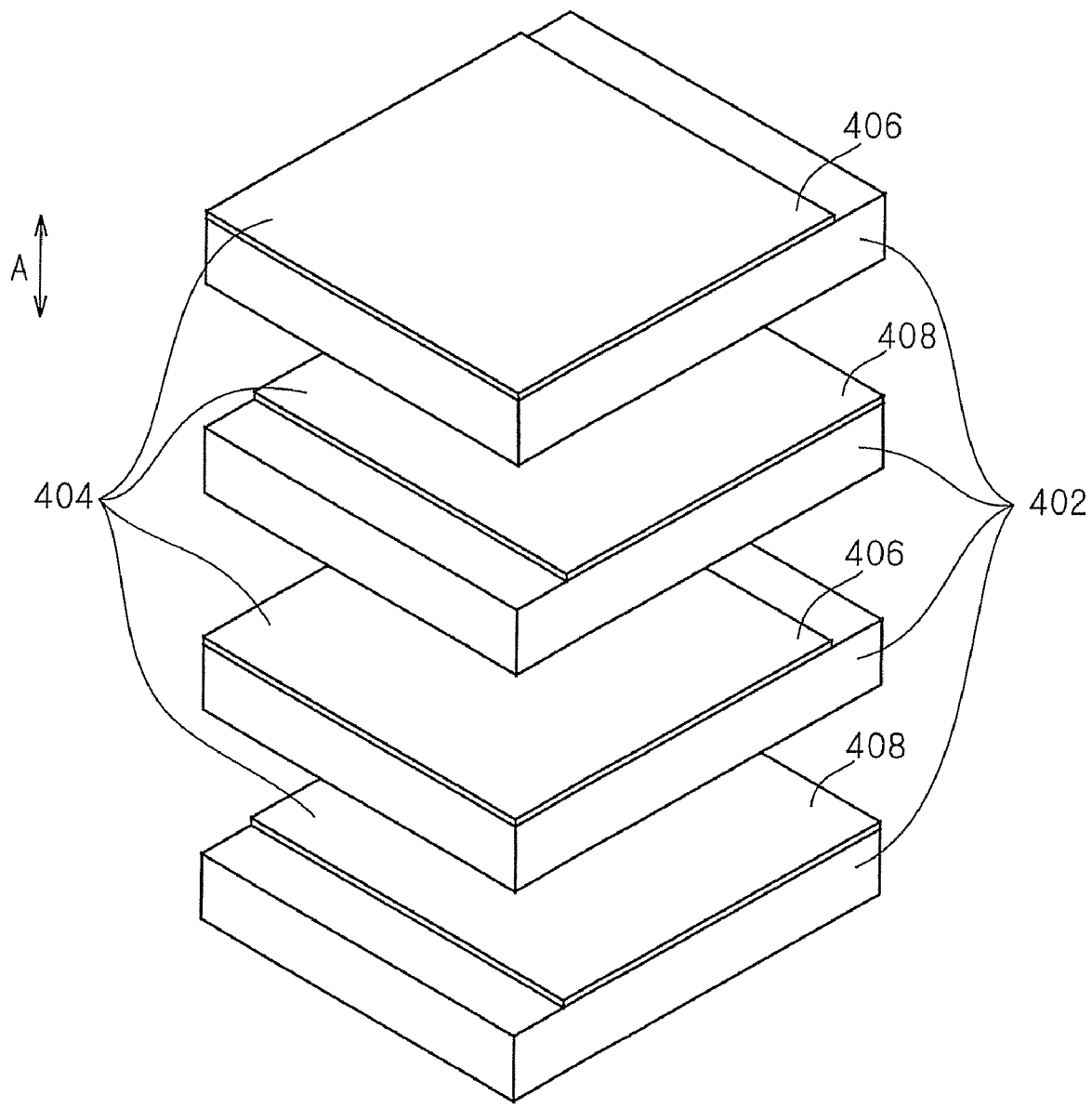
F I G . 7

(LI, NA, K)(NB, TA)O3 TYPE PIEZOELECTRIC/ELECTROSTRICTIVE CERAMIC COMPOSITION CONTAINING 30-50 MOL% TA AND PIEZOELECTRIC/ELECTRORESTRICTIVE DEVICE CONTAINING THE SAME

BACKGROUND OF THE INVENTION

1. Field of the Invention

The invention relates to a piezoelectric/electrostrictive ceramic composition and a piezoelectric/electrostrictive device using the piezoelectric/electrostrictive ceramic composition.

2. Description of the Background Art

A piezoelectric/electrostrictive actuator has an advantage of being able to precisely control a displacement in submicron order. Particularly, a piezoelectric/electrostrictive actuator using a sintered body of a piezoelectric/electrostrictive ceramic composition as a piezoelectric/electrostrictive body can precisely control a displacement and additionally has advantages of high electric-mechanical conversion efficiency, high motive power, high response speed, high durability, and low electric power consumption and using these advantages, the actuator is used for heads of ink jet printers, injectors of diesel engines, and the like.

As a piezoelectric/electrostrictive ceramic composition for piezoelectric/electrostrictive actuators, conventionally Pb(Zr, Ti)O$_3$ (PZT)-type piezoelectric/electrostrictive ceramic compositions have been employed; however the effect of the elution of lead from sintered bodies on the global environments has become a serious concern and since then, a (Li, Na, K)(Nb, Ta)O$_3$ type piezoelectric/electrostrictive ceramic composition has been investigated.

For example, Yasuyoshi Saito et al, "High Performance Lead-Free Piezoelectric Ceramics in the (K, Na) NbO3—LiTaO3 Solid Solution System", Ferroelectrics (United States of America), 2006, Volume 338, pp. 17-32 discloses a (Li, Na, K)(Nb, Ta)O$_3$ type piezoelectric/electrostrictive ceramic composition having a stoichiometric composition.

Further, International Publication No. 2006/095716 discloses that with respect to the (Li, Na, K)(Nb, Ta)O$_3$ type piezoelectric/electrostrictive ceramic composition, the piezoelectric/electrostrictive property can be improved by making the number of atoms in an A site element in excess of the number of atoms in a B site element.

However, with respect to the conventional (Li, Na, K)(Nb, Ta)O$_3$ type piezoelectric/electrostrictive ceramic composition, there is a problem that unless the firing temperature is a rather high temperature, sintering cannot be sufficiently promoted and thus the sintered density becomes low and the electric field-induced strain, which is important for a piezoelectric/electrostrictive actuator, cannot be necessarily sufficient at the time of high electric field application.

Further, with respect to the conventional (Li, Na, K)(Nb, Ta)O$_3$ type piezoelectric/electrostrictive ceramic composition, it is required to carry out firing in an atmosphere enriched in terms of oxygen concentration more than an air atmosphere in order to suppress the evaporation of an alkali component such as Li, and in some cases, it is required to carry out firing in an oxygen atmosphere with an oxygen concentration of 100%. Such a restriction in production leads to an increase in production cost and therefore, it is not desirable.

In addition, the (Li, Na, K)(Nb, Ta)O$_3$ type piezoelectric/electrostrictive ceramic composition has a orthorhombic-tetragonal phase transition temperature (hereinafter, simply referred to as a "phase transition temperature") T$_{OT}$ and has a characteristic that the electric field-induced strain becomes maximum at a temperature near the phase transition temperature T$_{OT}$. However, depending on the composition, since the phase transition temperature T$_{OT}$ is out of a practically usable temperature range, it is sometimes impossible to obtain sufficient electric field-induced strain or even if the phase transition temperature T$_{OT}$ is in a practically usable temperature range, since the maximum value of the electric field-induced strain at a temperature near the phase transition temperature T$_{OT}$ cannot become sufficiently high, it is sometimes impossible to obtain sufficient electric field-induced strain at a practically usable temperature.

SUMMARY OF THE INVENTION

The invention relates to a piezoelectric/electrostrictive ceramic composition and a piezoelectric/electrostrictive device using the piezoelectric/electrostrictive ceramic composition.

According to a first aspect of the invention, the piezoelectric/electrostrictive ceramic composition has a composition wherein Li, Na, and K are contained as first elements; Nb and Ta are contained as second elements; O is contained as a third element; a ratio of the total number of atoms of the first elements to the total number of atoms of the second elements of higher than 1; and the ratio of the number of Ta atoms to the total number of atoms of the second elements of 10 mol % or more and 50 mol % or less as a whole, and comprises a perovskite type oxide wherein the first elements are A site composing elements and the second elements are B site composing elements.

It is possible to obtain a (Li, Na, K)(Nb, Ta)O$_3$ type piezoelectric/electrostrictive ceramic composition capable of being sintered at a low temperature and having good electric field-induced strain at the time of high electric field application at a practically usable temperature.

Further, the invention provides a piezoelectric/electrostrictive device including a piezoelectric/electrostrictive film, which is a sintered body of the piezoelectric/electrostrictive ceramic composition; and electrode films on both main faces of the piezoelectric/electrostrictive film.

Accordingly, an object of the invention is to provide a (Li, Na, K)(Nb, Ta)O$_3$ type piezoelectric/electrostrictive ceramic composition capable of being sintered at a low temperature and having good electric field-induced strain at the time of high electric field application at a practically usable temperature.

These and other objects, features, aspects and advantages of the present invention will become more apparent from the following detailed description of the present invention when taken in conjunction with the accompanying drawings.

BRIEF DESCRIPTION OF THE DRAWINGS

FIG. 7 is an exploded perspective view of a portion of a piezoelectric/electrostrictive actuator.

DETAILED DESCRIPTION OF THE INVENTION

Figure 1:
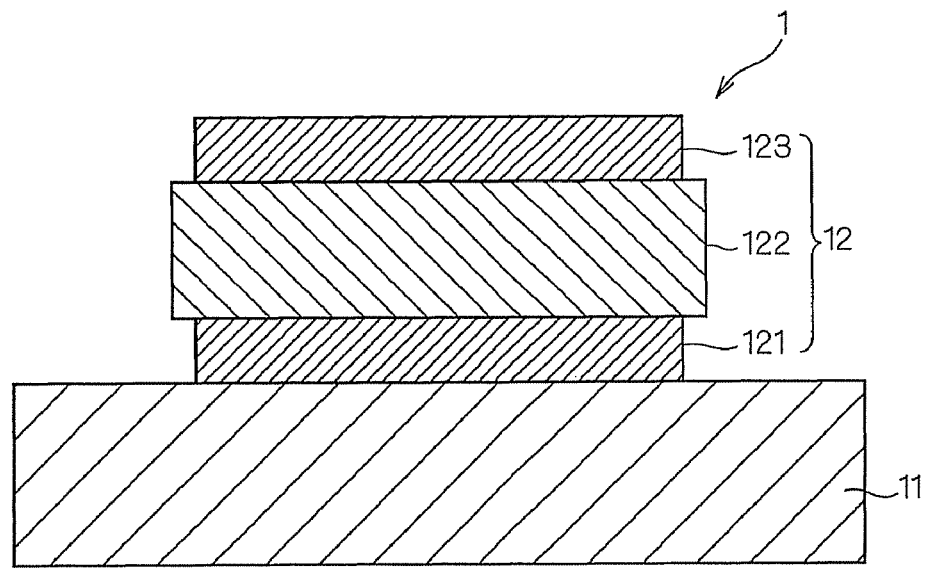
FIGS. 1 to 3 are cross-sectional views of piezoelectric/electrostrictive actuators.

Hereinafter, a piezoelectric/electrostrictive ceramic composition according to a preferred embodiment of the invention will be described and thereafter, an actuator using the piezoelectric/electrostrictive ceramic composition will be described. However, the following explanations do not mean that the application of the piezoelectric/electrostrictive ceramic composition of the invention is limited to an actuator. For example, the piezoelectric/electrostrictive ceramic composition of the invention may be used for piezoelectric/electrostrictive devices such as sensors.

<1: Piezoelectric/Electrostrictive Ceramic Composition>

{Composition}

A piezoelectric/electrostrictive ceramic composition according to a desirable embodiment of the invention has an $ABO_3$ type composition formula wherein lithium (Li), sodium (Na), and potassium (K) are contained as first elements A; niobium (Nb) and tantalum (Ta) are contained as second elements B; oxygen (O) is contained as a third element; a ratio (so-called A/B ratio) of the total number of atoms of the first elements A to the total number of atoms of the second elements B is higher than 1; and the ratio of the number of Ta atoms to the total number of atoms of the second elements B is 10 mol % or more and 50 mol % or less, and comprises a perovskite type oxide wherein the first elements A are A site composing elements and the second elements B are B site composing elements. Further, as an A site element, a monovalent element such as silver (Ag) may further be added and as a B site element, a pentavalent element such as vanadium (V) may further be added to this perovskite type oxide.

Further, the piezoelectric/electrostrictive ceramic composition according to a preferable embodiment of the invention desirably contains 0.1 parts by weight or more and 3 parts by weight or less of a hetero-phase of $Li_3NbO_4$ to the mother phase of 100 parts by weight of the perovskite type oxide. Accordingly, the sintering property of the piezoelectric/electrostrictive ceramic composition can be improved. The reason why the amount of $Li_3NbO_4$ is set to be 0.1 parts by weight or more and 3 parts by weight or less is because if the amount of $Li_3NbO_4$ is below this range, the sintering property of the piezoelectric/electrostrictive ceramic composition is lowered and the electric field-induced strain becomes small and at the same time, short circuit due to insulation breakdown tends to occur and if the amount of $Li_3NbO_4$ exceeds this range, the loss due to the hetero-phase becomes large and the electric field-induced strain becomes small and at the same time, short circuit due to insulation breakdown tends to occur.

The composition of the piezoelectric/electrostrictive ceramic composition according to a preferable embodiment of the invention is preferably defined by a general formula; $\{Li_y(Na_{1-x}K_x)_{1-y}\}_a(Nb_{1-z}Ta_z)O_3$ wherein a, x, y, and z respectively satisfy $1<a\leq1.05$, $0.30\leq x\leq0.70$, $0.02\leq y\leq0.10$ and $0.1\leq z\leq0.5$.

The reason why the A/B ratio is set to $1<a$ is to improve the sintering property of the piezoelectric/electrostrictive ceramic composition. That is, with respect to a (Li, Na, K)(Nb, Ta)$O_3$ type piezoelectric/electrostrictive ceramic composition having a stoichiometric composition, if the Ta amount is increased to satisfy $0.1\leq z$, as shown in FIG. 1 of Yasuyoshi Saito et al, "High Performance Lead-Free Piezoelectric Ceramics in the (K, Na) NbO3—LiTaO3 Solid Solution System", Ferroelectrics (United States of America), 2006, Volume 338, pp. 17-32, the sintering property is lowered and the firing temperature has to be increased to almost the melting point; however, if a non-stoichiometric composition wherein $1<a$ is employed, the sintering property is improved and the firing temperature can be lowered to 950 to 1050° C. Such an effect becomes especially significant within a range of $1.005\leq a$. The reason why an increase in the firing temperature is undesirable is because if the firing temperature is increased, the alkali components contained in the piezoelectric/electrostrictive ceramic composition are evaporated and it becomes impossible to stably obtain a good piezoelectric/electrostrictive property.

On the other hand, the reason why the A/B ratio is set to $a\leq1.05$ is because if it exceeds the range, dielectric loss tends to increase and the electric field-induced strain tends to be low under high electric field application.

The reason why the Ta amount is set to $0.1\leq z\leq0.5$ is because the tetragonal-orthorhombic phase transition temperature (hereinafter, simply referred to as a "phase transition temperature") $T_{OT}$ at which the piezoelectric/electrostrictive property is heightened can be kept near room temperature (−30° C. to 135° C.) within this range and thus the electric field-induced strain can be made high at the time of high electric field application.

The reason why the K and Li amounts are respectively set to $0.30\leq x\leq0.70$ and $0.02\leq y\leq0.10$ is because a piezoelectric/electrostrictive ceramic composition suitable for actuators can be obtained within these ranges.

For example, if x is below this range, the piezoelectric/electrostrictive property is sharply lowered. On the other hand, if x exceeds this range, sintering becomes difficult and the firing temperature has to be higher.

Further, if y is below this range, all the same, sintering becomes difficult and the firing temperature has to be higher. On the other hand, if y exceeds this range, the hetero-phase precipitation is increased to result in decrease of the insulation.

Additionally, a Mn compound may be added as an auxiliary component to the composition having the $ABO_3$ type composition formula as the main component. In the case the Mn compound is added, it is desirable to add the Mn compound in an addition amount in terms of Mn atoms to be 3 parts by mole or less to 100 parts by mole of the main component. The reason why the addition amount of the Mn compound is 3 parts by mole or less is because if it exceeds the range, the hetero-phase is increased in the inside of the sintered body, the dielectric loss is increased and the electric field-induced strain tends to become small at the time of high electric field application.

Herein, the amount of the Mn compound is sufficient even if it is added in a very small amount. For example, even when adding the Mn compound in an amount of only 0.001 parts by mole in terms of Mn atoms to 100 parts by mole of the main component, the polarization treatment of the sintered body is made easy and the electric field-induced strain can be made high at the time of high electric field application.

The Mn compound is desirably a compound of divalent Mn in terms of atomic valence. For example, manganese oxide (MnO) and other compounds in which manganese is in solid solution phase are desirable, and a compound of trilithium niobate ($Li_3NbO_4$) in which manganese forms a solid solution is particularly desirable. Herein, "mainly divalent" means that Mn other than divalent Mn in terms of atomic valence may be included and that the atomic valence of Mn included most abundantly is divalence. The atomic valence of Mn can be confirmed by X-ray absorption near-edge structure (XANES). Further, Mn is desirable to exist as an element constituting the hetero-phase of a manganese compound inside the ceramic sintered body without being incorporated in the crystal lattice of the perovskite type oxide, which is the mother phase.

Introduction of such a Mn compound into the inside of the sintered body can prevent hardening due to the addition of the Mn compound and increase the electric field-induced strain.
{Phase Transition Temperature}

In general, the (Li, Na, K)(Nb, Ta)$O_3$ type perovskite oxide and its modified substances show phase transition from cubic system to tetragonal system and to orthorhombic system in this order from a high temperature to a low temperature and with respect to the piezoelectric/electrostrictive ceramic composition according to a preferable embodiment of the invention, it is desirable to select the composition with which the phase transition temperature $T_{OT}$ becomes near room temperature. It is because if the phase transition temperature $T_{OT}$ is near room temperature, the electric field-induced strain can be made high at room temperature in the case of high electric field application.
{Production of Ceramics Powder}

In the production of a ceramics powder of the piezoelectric/electrostrictive ceramic composition, first, starting materials of component elements (Li, Na, K, Nb, Ta, Mn, and the like) of the piezoelectric/electrostrictive ceramic composition are added with a dispersion medium and mixed by a ball mill or the like. As the starting materials, compounds such as oxides, carbonates, and tartrates may be used and as the dispersion medium, an organic solvent such as ethanol, toluene, or acetone may be used. Thereafter, the dispersion medium is removed from the obtained mixed slurry by a technique such as evaporation drying or filtration to obtain a starting material mixture. Successively, the starting material mixture is calcined at 600 to 1300° C. to obtain a ceramics powder. In order to obtain a ceramics powder with a desired particle diame ceramics powder may be pulverized after calcination by a ball mill or the like. Further, the ceramics powder may be produced not by the solid-phase reaction method but by an alkoxide method or a coprecipitation method. Further, after the perovskite type oxide is synthesized, a starting material of Mn for supplying Mn composing the Mn compound may be added. In this case, it is desirable to add manganese dioxide ($MnO_2$) as the Mn starting material to the synthesized perovskite type oxide. The tetravalent Mn constituting manganese dioxide added in such a manner is reduced to be divalent Mn during firing and it contributes to improvement of the electric field-induced strain. Further, the perovskite type oxide may be synthesized via a columbite compound of the B site element.

The average particle diameter of the ceramics powder is preferably 0.07 to 10 μm and more preferably 0.1 to 3 μm. To adjust the particle diameter of the ceramics powder, the ceramics powder may be thermally treated at 400 to 850° C. Since finer particles are united more easily with other particles, execution of the thermal treatment gives a ceramics powder with uniform particle diameter and thus a sintered body with uniform particle diameter can be obtained.

<2 Piezoelectric/Electrostrictive Actuator>
{Entire Structure}

Figure 2:
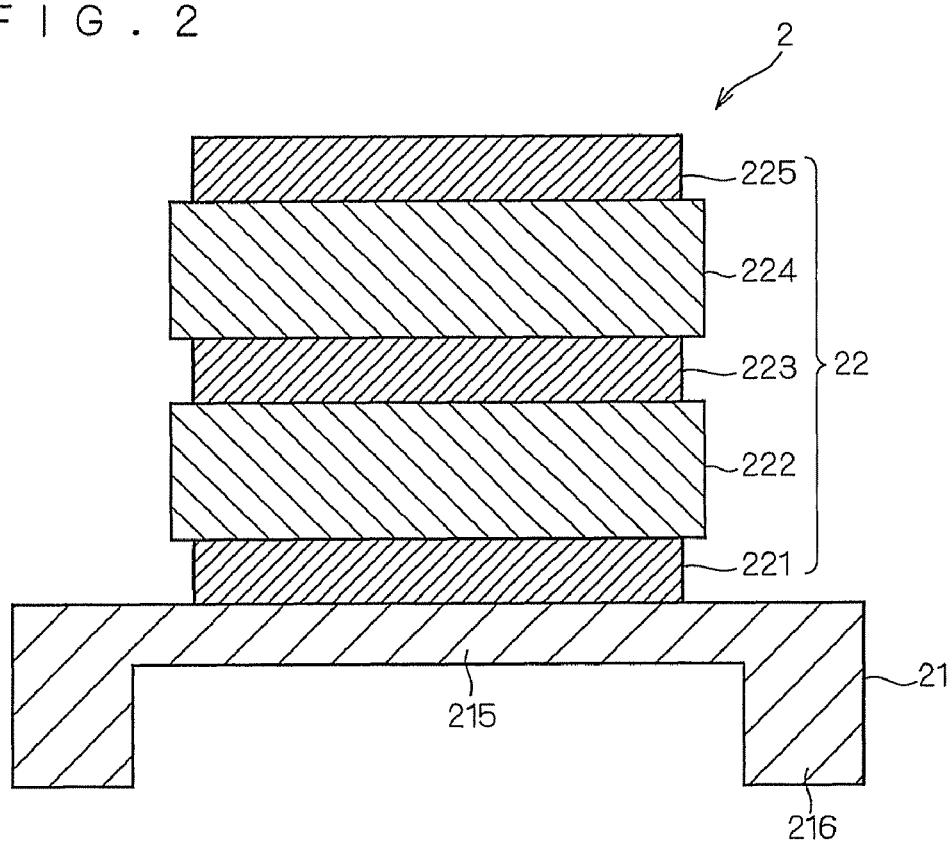

FIG. 1 and FIG. 2 are schematic drawings of structure examples of piezoelectric/electrostrictive actuators 1 and 2 using the above-mentioned piezoelectric/electrostrictive ceramic composition and FIG. 1 shows a cross-sectional view of a monolayer type piezoelectric/electrostrictive actuator 1 and FIG. 2 shows a cross-sectional view of a multilayer type piezoelectric/electrostrictive actuator 2.

As shown in FIG. 1, the piezoelectric/electrostrictive actuator 1 has a structure formed by layering an electrode film 121, a piezoelectric/electrostrictive film 122, and an electrode film 123 on the upper face of a substrate 11 in this order. The electrode films 121 and 123 on both main faces of the piezoelectric/electrostrictive film 122 are opposed to each other while sandwiching the piezoelectric/electrostrictive film 122. A laminate body 12 of the electrode film 121, the piezoelectric/electrostrictive film 122, and the electrode film 123 is firmly stuck to the substrate 11.

Further, as shown in FIG. 2, the piezoelectric/electrostrictive actuator 2 has a structure formed by layering an electrode film 221, a piezoelectric/electrostrictive film 222, an electrode film 223, a piezoelectric/electrostrictive film 224, and an electrode film 225 on the upper face of a substrate 21 in this order. The electrode films 221 and 223 on both main faces of the piezoelectric/electrostrictive film 222 are opposed to each other while sandwiching the piezoelectric/electrostrictive film 222 and the electrode films 223 and 225 on both main faces of the piezoelectric/electrostrictive film 224 are set face to face while sandwiching the piezoelectric/electrostrictive film 224. A laminate body 22 of the electrode film 221, the piezoelectric/electrostrictive film 222, the electrode film 223, the piezoelectric/electrostrictive film 224, and the electrode film 225 is firmly stuck to the substrate 21. Although FIG. 2 shows the case in which the structure has two piezoelectric/electrostrictive films, it may have three or more piezoelectric/electrostrictive films.

Herein, "firmly stuck" means that the laminated bodies 12 and 22 are joined to the substrates 11 and 21 by solid-phase reaction in the interfaces of the substrates 11 and the laminated body 12, and that of the substrate 21 and the laminated body 22 without using an organic adhesive or an inorganic adhesive. In addition, a laminated body may be joined to a substrate by solid-phase reaction in the interface of the substrate and the piezoelectric/electrostrictive film that is the lowest layer of the laminated body.

In the piezoelectric/electrostrictive actuators 1 and 2, when voltage is applied, the piezoelectric/electrostrictive bodies 122, 222, and 224 are contracted or extended in the vertical direction to the electric field and as a result, flexion displacement occurs depending on the applied voltage.
{Piezoelectric/Electrostrictive Film}

The piezoelectric/electrostrictive films 122, 222, and 224 are sintered bodies of the above-mentioned piezoelectric/electrostrictive ceramic composition.

The thickness of the piezoelectric/electrostrictive films 122, 222, and 224 is preferably 0.5 to 50 μm, more preferably 0.8 to 40 μm, and even more preferably 1 to 30 μm. That is because if it is below the range, the densification tends to be insufficient. Further, that is also because if it exceeds the range, the shrinkage stress in a sintering process tends to be significant and thus the thickness of the substrates 11 and 21 has to be thick and it becomes difficult to miniaturize the piezoelectric/electrostrictive actuators 1 and 2.
{Electrode Film}

Materials of the electrode films 121, 123, 221, 223, and 225 may be metals such as platinum, palladium, rhodium, gold, or silver, or their alloys. Among them, in terms of the high resistance to heat in a firing process, platinum or an alloy containing mainly platinum is preferred. Further, depending on the firing temperature, a silver-palladium alloy or the like may also be suitably used.

The thickness of the electrode films 121, 123, 221, 223, and 225 is preferably 15 μm or less and more preferably 5 μm or less. That is because if it exceeds the range, the electrode films 121, 123, 221, 223, and 225 work as a buffer layer and the flexion displacement tends to be small. Further, for proper performance of the function of the electrode films 121, 123, 221, 223, and 225, the thickness is preferably 0.05 μm or more.

The electrode films 121, 123, 221, 223, and 225 are preferably formed so as to cover the regions substantially contributing to the flexion displacement of the piezoelectric/electrostrictive films 122, 222, and 224. For example, they are preferably formed so as to cover the region of 80% or more of both main faces of the piezoelectric/electrostrictive films 122, 222, and 224 including the center portion of the piezoelectric/electrostrictive films 122, 222, and 224.

{Substrate}

Materials for the substrates 11 and 21 are ceramics, however types thereof are not limited. Nevertheless, in terms of the resistance to heat, chemical stability, and insulation, ceramics containing at least one component selected from the group consisting of stabilized zirconium oxide, aluminum oxide, magnesium oxide, mullite, aluminum nitride, silicon nitride, and glass are preferred. Especially, in terms of the mechanical strength and toughness, stabilized zirconium oxide is further preferred. Herein, "stabilized zirconium oxide" means zirconium oxide whose crystal phase transition is suppressed by adding a stabilizing agent and include stabilized zirconium oxide and additionally partially stabilized zirconium oxide.

Examples of the stabilized zirconium oxide include zirconium oxide containing 1 to 30 mol % of calcium oxide, magnesium oxide, yttrium oxide, ytterbium oxide, cerium oxide or oxides of rare earth metals as a stabilizing agent. Especially, in terms of high mechanical strength, zirconium oxide containing yttrium oxide as a stabilizing agent is preferred. The content of yttrium oxide is preferably 1.5 to 6 mol % and more preferably 2 to 4 mol %. Further, in addition to the yttrium oxide, 0.1 to 5 mol % of aluminum oxide is also preferable to be included. The crystal phase of stabilized zirconium oxide may be a mixed crystal of the cubic and the monoclinic, a mixed crystal of the tetragonal and the monoclinic, or a mixed crystal of the cubic, the tetragonal, and the monoclinic, however it is preferred that the main crystal phase is a mixed crystal of the tetragonal and the cubic or the tetragonal in terms of the mechanical strength, toughness, and durability.

The thickness of the substrates 11 and 21 is preferably 1 to 1000 μm, more preferably 1.5 to 500 μm, and even more preferably 2 to 200 μm. That is because if it is below the range, the mechanical strength of the piezoelectric/electrostrictive actuators 1 or 2 tends to be lowered. Further, that is also because if it exceeds the range, the rigidity of the substrates 11 and 21 becomes high and the flexion displacement due to contraction and extension of the piezoelectric/electrostrictive films 122, 222, and 224 tends to be small when applying voltage.

The surface shape of the substrates 11 and 21 (the shape of the face to which the laminated body is stuck) is not particularly limited and may be triangular, quadrangular (rectangular, regular tetragonal), elliptical, or circular and the triangular shape and quadrangular shape may be rounded in the corners. A composite shape formed by combining these basic shapes may be also allowed.

The thickness of the substrate 11 of the monolayer type piezoelectric/electrostrictive actuator 1 is even. On the other hand, the thickness of the substrate 21 of the multilayer type piezoelectric/electrostrictive actuator 2 is thinner in a center part 215 to which the laminated body 22 is stuck than in peripheries 216. That is because the flexion displacement can be made large while maintaining the mechanical strength of the substrate 21. The substrate 21 may be used for the monolayer type piezoelectric/electrostrictive actuator 1.

Figure 3:
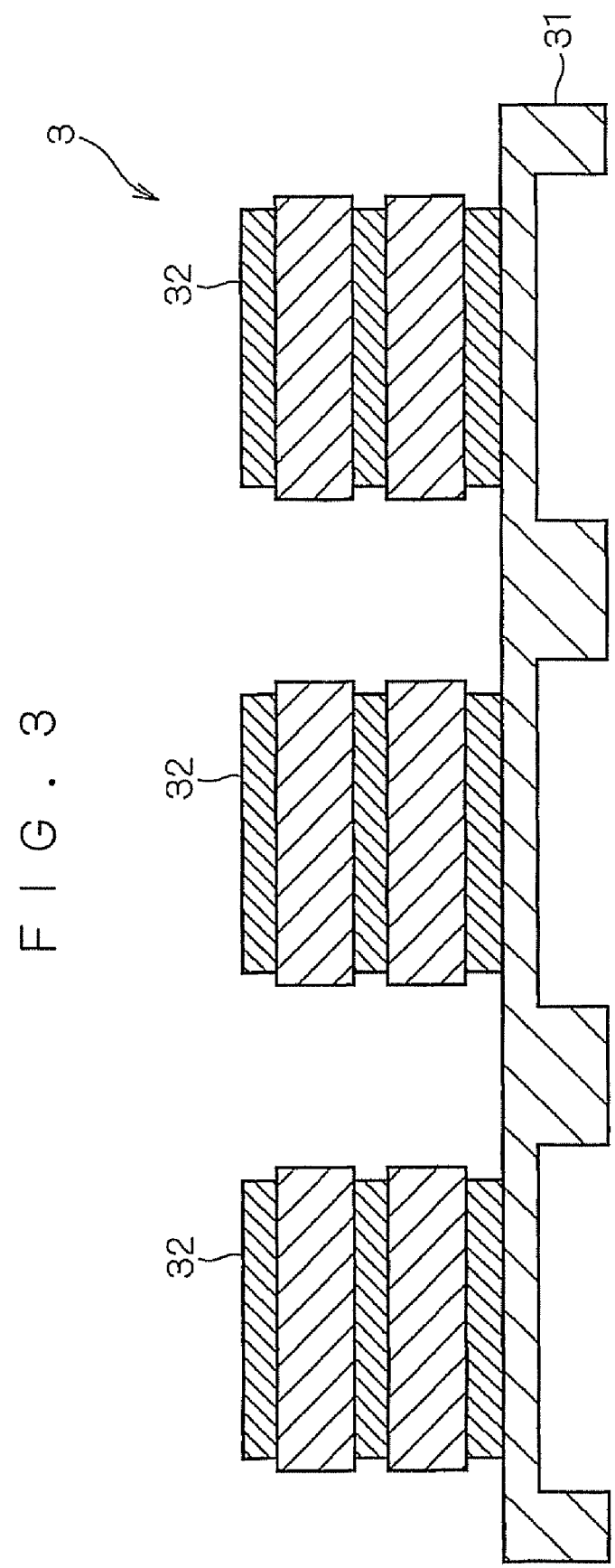

As shown in the cross-sectional view of FIG. 3, a substrate 31 formed by repeating unit structures may be used using the substrate 21 shown in FIG. 2 as a unit structure. In this case, a laminated body 32 is firmly stuck on each unit structure to construct the piezoelectric/electrostrictive actuator 3.

{Production of Piezoelectric/Electrostrictive Actuator}

In the case of production of the monolayer type piezoelectric/electrostrictive actuator 1, the electrode film 121 is first formed on the substrate 11. The electrode film 121 may be formed by a method such as ion beam, sputtering, vacuum evaporation, PVD (Physical Vapor Deposition), ion plating, CVD (Chemical Vapor Deposition), plating, aerosol deposition, screen printing, spraying or dipping. Especially, in terms of adhesion of the substrate 11 and the piezoelectric/electrostrictive film 122, the sputtering method and the screen printing method are preferred. The formed electrode film 121 can be firmly stuck to the substrate 11 and the piezoelectric/electrostrictive film 122 by the heat treatment. The heat treatment temperature varies depending on the material and formation method of the electrode film 121, however it is approximately 500 to 1400° C.

Successively, the piezoelectric/electrostrictive film 122 is formed on the electrode film 121. The piezoelectric/electrostrictive film 122 can be formed by a method such as ion beam, sputtering, vacuum evaporation, PVD (Physical Vapor Deposition), ion plating, CVD (Chemical Vapor Deposition), plating, sol-gel, aerosol deposition, screen printing, spraying or dipping. Especially, in terms of high precision of plane shape and thickness and continuous formability of the piezoelectric/electrostrictive film, a screen printing method is preferred.

Successively, an electrode film 123 is formed further on the piezoelectric/electrostrictive film 122. The electrode film 123 can be formed in the same manner as the electrode film 121.

Thereafter, the substrate 11 on which the laminated body 12 is formed is fired integrally. Sintering of the piezoelectric/electrostrictive film 122 is promoted by the firing while the electrode films 121 and 123 are thermally treated. The firing temperature of the piezoelectric/electrostrictive film 122 is preferably 800 to 1250° C. and more preferably 900 to 1200° C. That is because if it is below this range, densification of the piezoelectric/electrostrictive film 122 becomes insufficient and firm bonding of the substrate 11 and the electrode film 121 and the firm bonding of the electrode films 121 and 123 and the piezoelectric/electrostrictive film 122 tend to be incomplete. Further, if it exceeds this range, the piezoelectric/electrostrictive property of the piezoelectric/electrostrictive film 122 tends to be deteriorated. The retention time of the highest temperature during the firing is preferably 1 minute to 10 hours and more preferably 5 minutes to 4 hours. That is because if it is below this range, densification of the piezoelectric/electrostrictive film 122 becomes insufficient. Further, if it exceeds this range, the piezoelectric/electrostrictive property of the piezoelectric/electrostrictive film 122 tends to be deteriorated.

In addition, the heat treatment of the electrode films 121 and 123 is preferably carried out together with firing in terms of productivity, and it does not inhibit execution of heat treatment every time after formation of the electrode films 121 and 123. However, in the case the piezoelectric/electrostrictive film 122 is fired before the heat treatment of the electrode film 123, the electrode film 123 is thermally treated at a lower temperature than the firing temperature of the piezoelectric/electrostrictive film 122.

On completion of the firing, polarization treatment is carried out under proper conditions. The polarization treatment can be carried out by a conventionally known technique and although depending on the Curie temperature of the piezoelectric/electrostrictive film 122, it is preferably carried out by heating to 40 to 200° C.

The multilayer type piezoelectric/electrostrictive actuator 2 can also be produced similarly to the monolayer type piezoelectric/electrostrictive actuator 1, except that the numbers of the piezoelectric/electrostrictive films and the electrode films to be formed are increased.

The piezoelectric/electrostrictive actuator 1 can be produced by a green sheet lamination method, which is employed commonly in the production of laminated ceramic electronic parts. In the green sheet lamination method, first, a binder, a plasticizer, a dispersant, and a dispersion medium are added to the ceramics powder and mixed by a ball mill or the like. The obtained slurry is formed into a sheet-like shape by a doctor blade method to obtain a compact.

Successively, films of an electrode paste are printed on both main faces of the compact by a screen printing method or the like. The electrode paste to be used is obtained by adding a solvent, a vehicle, and glass frit to a powder of the above-mentioned metal or alloy.

Further successively, the compact on which the films of the electrode paste are formed on both main faces and a substrate are bonded by press bonding.

Thereafter, the substrate on which the laminated body is formed is integrally fired and on completion of the firing, polarization treatment is carried out under proper conditions.

<3 Another Example of Piezoelectric/Electrostrictive Actuator>

Figure 4:
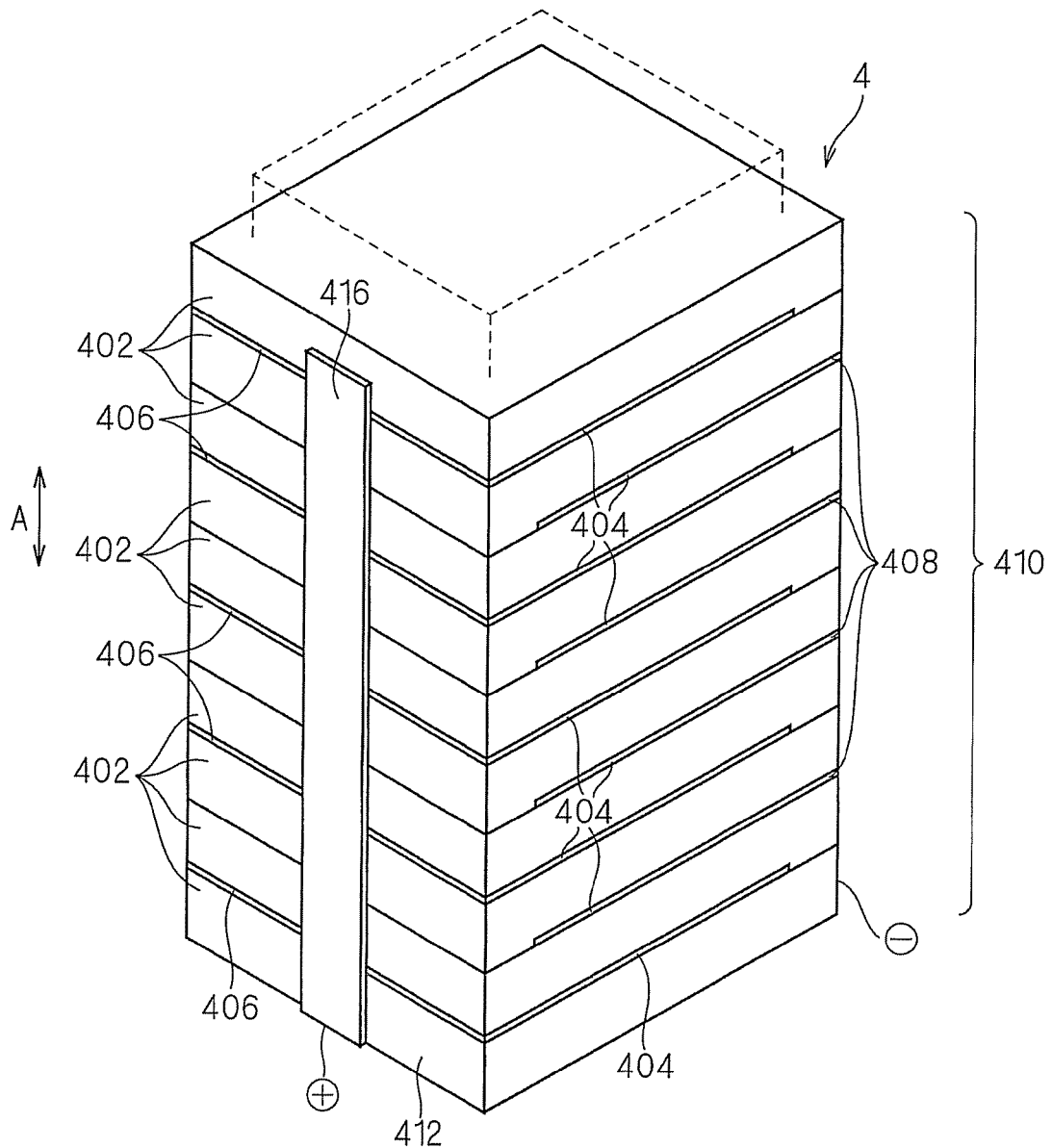
FIG. 4 is a perspective view of a piezoelectric/electrostrictive actuator.
Figure 5:
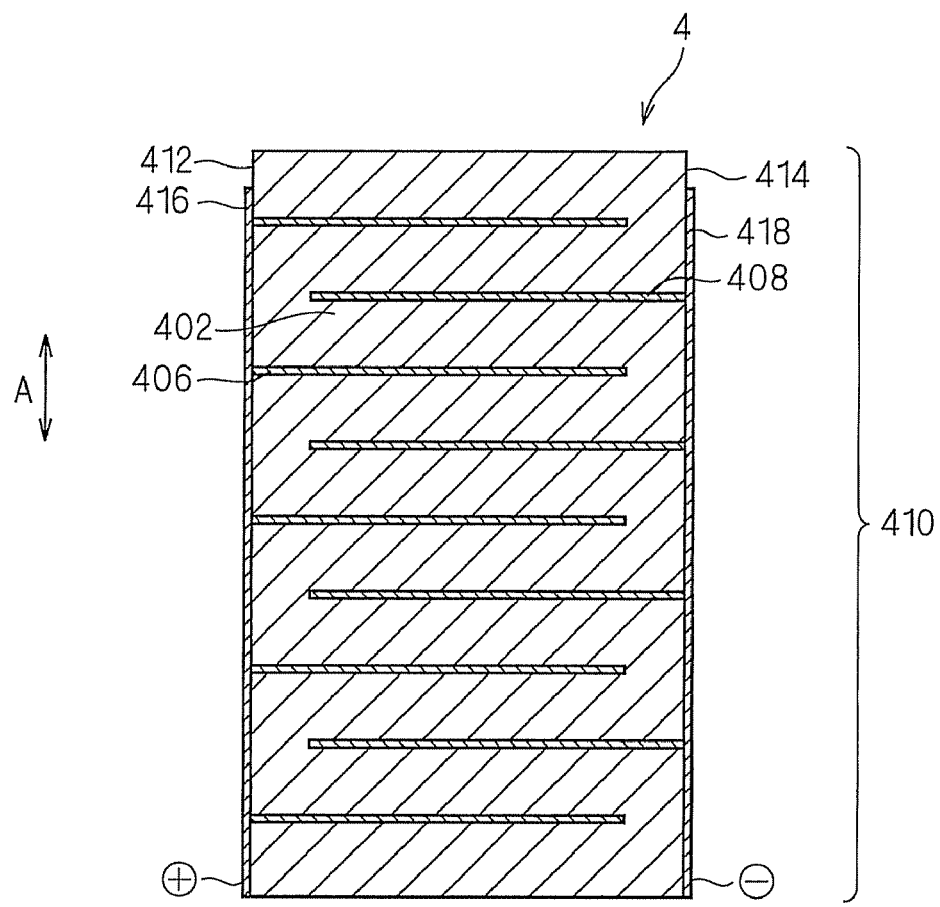
FIG. 5 is a longitudinal sectional view of a piezoelectric/electrostrictive actuator.
Figure 6:
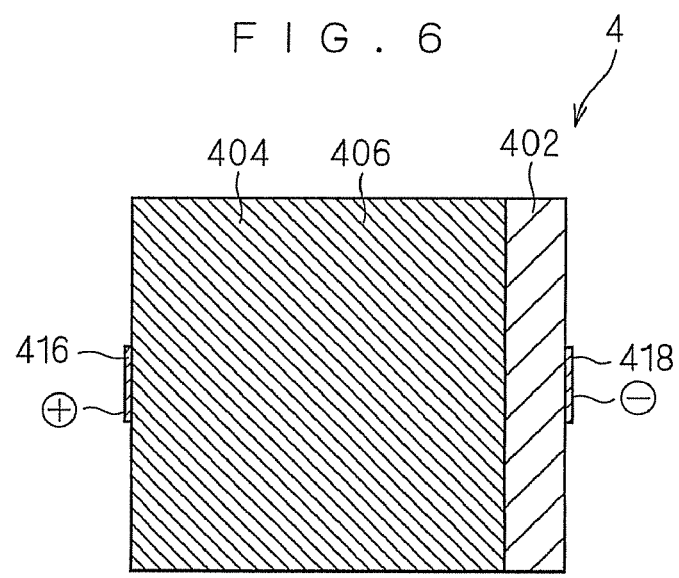
FIG. 6 is a transverse sectional view of a piezoelectric/electrostrictive actuator.

FIG. 4 to FIG. 6 show schematic drawings of structure examples of a piezoelectric/electrostrictive actuator 4 using the above-mentioned piezoelectric/electrostrictive ceramic composition and FIG. 4 is a perspective view of the piezoelectric/electrostrictive actuator 4; FIG. 5 is a longitudinal sectional view of the piezoelectric/electrostrictive actuator 4; and FIG. 6 is a transverse sectional view of the piezoelectric/electrostrictive actuator 4.

As shown in FIG. 4 to FIG. 6, the piezoelectric/electrostrictive actuator 4 has a structure formed by alternately layering the piezoelectric/electrostrictive film 402 and an inner electrode film 404 in the direction of the axis A and having outer electrode films 416 and 418 formed in end faces 412 and 414 of a laminated body 410 of the piezoelectric/electrostrictive film 402 and the inner electrode film 404. As shown in FIG. 7 by an exploded perspective view showing a portion of the piezoelectric/electrostrictive actuator 4 disassembled in the direction of the axis A, the inner electrode film 404 includes a first inner electrode film 406 which reaches the end face 412 but does not reach the end face 414 and a second inner electrode film 408 which reaches the end face 414 but does not reach the end face 412. The first inner electrode film 406 and the second inner electrode film 408 are alternately formed. The first inner electrode film 406 is brought into contact with the outer electrode film 416 on the end face 412 and electrically connected with the outer electrode film 416. The second inner electrode film 408 is brought into contact with the outer electrode film 418 on the end face 414 and electrically connected with the outer electrode film 418. Accordingly, when the outer electrode film 416 is connected to the plus side of a driving signal source and the outer electrode film 418 is connected to the minus side of the driving signal source, driving signals are applied to the first inner electrode film 406 and the second inner electrode film 408 opposed to each other, between which the piezoelectric/electrostrictive film 402 is inserted, and an electric field is applied to the piezoelectric/electrostrictive film 402 in the thickness direction. As a result, the piezoelectric/electrostrictive film 402 is extended and contracted in the thickness direction and the laminated body 410 is deformed into the shape shown by the dotted line shown in FIG. 4 as a whole.

Different from the piezoelectric/electrostrictive actuators 1 to 3 described already, the piezoelectric/electrostrictive actuator 4 includes no substrate to which the laminated body 410 is firmly stuck. Further, the piezoelectric/electrostrictive actuator 4 is also called as an "offset type piezoelectric/electrostrictive actuator" since the first inner electrode film 406 and the second inner electrode film 408 with different patterns are alternately formed.

The piezoelectric/electrostrictive film 402 is a sintered body of the above-mentioned piezoelectric/electrostrictive ceramic composition. The thickness of the piezoelectric/electrostrictive film 402 is preferably 5 to 500 μm. That is because if it is below the range, it becomes difficult to produce green sheets described below. Further, that is because if it exceeds the range, it becomes difficult to apply a sufficient electric field to the piezoelectric/electrostrictive film 402.

Materials for the inner electrode film 404 and the outer electrode films 416 and 418 are metals such as platinum, palladium, rhodium, gold, or silver or their alloys. Among them, for the material of the inner electrode film 404, in terms of the high resistance to heat during firing and easiness of co-sintering with the piezoelectric/electrostrictive film 402, platinum or an alloy containing mainly platinum is preferred. Further, depending on the firing temperature, an alloy such as a silver-palladium alloy may also be preferably used.

The thickness of the inner electrode film 402 is preferably 10 μm or less. That is because if it exceeds the range, the inner electrode film 402 works as a buffer layer and the flexion displacement tends to be small. Further, for proper performance of the function of the inner electrode film 402, the thickness is even more preferably 0.1 μm or more.

Although FIG. 4 to FIG. 6 show the case where there are ten layers of the piezoelectric/electrostrictive films 402, there may be nine layers or less or eleven layers or more of the piezoelectric/electrostrictive films 402.

In production of the piezoelectric/electrostrictive actuator 4, first, a ceramics powder of the above-mentioned piezoelectric/electrostrictive ceramic composition is added with a plasticizer, a dispersant, and a dispersion medium and mixed by a ball mill or the like. Thereafter, the obtained slurry is formed into a sheet-like shape by a doctor blade method or the like to obtain a green sheet.

Successively, the green sheet is punched by using a punch and a die to form holes or the like in the green sheet for positioning.

Further successively, an electrode paste is applied to the surface of the green sheet by screen printing or the like to obtain a green sheet on which patterns of the electrode paste are formed. The patterns of the electrode paste include two types: that is, a pattern of the first electrode paste to be the first inner electrode film 406 after firing and a pattern of the second electrode paste to be the second inner electrode film 408 after firing. Of course, only one kind of pattern of the electrode paste may be formed and every other green sheet is turned at 180° to obtain the inner electrode films 406 and 408 after firing.

Next, green sheets on which the patterns of the first electrode paste are formed and green sheets on which the patterns of the second electrode paste are formed are alternately layered, and a green sheet to which no electrode paste is applied is further layered on the top, and then the layered green sheets are pressurized and bonded in the thickness direction. At this time, the positions of the positioning holes formed on the green sheets are aligned. Further, in pressure bonding of the layered green sheets, it is also desirable to carry out pressure bonding of the green sheets with the green sheets heated by pre-heating the die to be used for pressure bonding.

The pressure-bonded body of the green sheets obtained in such a manner is fired and the obtained sintered body is processed by a dicing saw or the like to obtain a laminated body 410. Thereafter, outer electrode films 416 and 418 are formed in the end faces 412 and 414 of the laminated body 410 by baking, evaporation, sputtering or the like and polarization treatment is carried out to obtain the piezoelectric/electrostrictive actuator 4.

EXAMPLES

Hereinafter, Examples 1 to 42 of piezoelectric/electrostrictive ceramic compositions of the invention and Comparative Examples 1 to 9 of piezoelectric/electrostrictive ceramic compositions out of the scope of the invention will be explained. However, the following Examples should not be considered to limit the scope of the invention.

{Production of Piezoelectric/Electrostrictive Devices for Evaluation}

In production of piezoelectric/electrostrictive devices for evaluation, first, starting materials such as lithium carbonate ($Li_2CO_3$), sodium tartrate monohydrate ($C_4H_5O_6Na.H_2O$), potassium tartrate ($C_4H_5O_6K$), niobium oxide ($Nb_2O_5$), tantalum oxide ($Ta_2O_5$) were weighed to give the compositions as shown in Table 1 to Table 5. In Table 1 to Table 5, x, y, z and a are parameters of the general formula $\{Li_y(Na_{1-x}K_x)_{1-y}\}_a(Nb_{1-z}Ta_z)O_3$ and the Mn amount is the addition amount relative to 100 parts by mole of the main component defined by the above-mentioned general formula.

TABLE 1

| | firing temperature (° C.) | x | y | z | a | Mn amount (parts by mole) | $S_{4000}$ (ppm) around room temperature | $S_{4000}$ (ppm) around $T_{OT}$ | $d_{31}$ (pm/V) | $T_{OT}$ (° C.) | $Li_3NbO_4$ amount (parts by weight) |
|---|---|---|---|---|---|---|---|---|---|---|---|
| Comparative Example 1 | 970 | 0.45 | 0.06 | 0.080 | 1.03 | 0.00 | 243 | 471 | 38 | 140 | 1.0 to 1.5 |
| Example 1 | 970 | 0.45 | 0.06 | 0.100 | 1.03 | 0.00 | 280 | 506 | 43 | 131 | |
| Example 2 | 970 | 0.45 | 0.06 | 0.150 | 1.03 | 0.00 | 260 | 546 | 40 | 110 | |
| Example 3 | 970 | 0.45 | 0.06 | 0.200 | 1.03 | 0.00 | 278 | 561 | 44 | 88 | |
| Example 4 | 970 | 0.45 | 0.06 | 0.250 | 1.03 | 0.00 | 299 | 552 | 47 | 66 | |
| Example 5 | 970 | 0.45 | 0.06 | 0.300 | 1.03 | 0.00 | 549 | 549 | 64 | 44 | |
| Example 6 | 970 | 0.45 | 0.06 | 0.400 | 1.03 | 0.00 | 393 | 501 | 39 | −20 | |
| Example 7 | 970 | 0.45 | 0.06 | 0.500 | 1.03 | 0.00 | 410 | 503 | 43 | −28 | |
| Comparative Example 2 | 970 | 0.45 | 0.06 | 0.520 | 1.03 | 0.00 | 239 | 460 | 28 | <−30 | |
| Example 8 | 970 | 0.45 | 0.06 | 0.300 | 1.03 | 0.02 | 584 | 584 | 79 | 46 | |
| Example 9 | 970 | 0.45 | 0.06 | 0.300 | 1.03 | 0.10 | 619 | 619 | 84 | 37 | |

TABLE 2

| | firing temperature (° C.) | x | y | z | a | Mn amount (parts by mole) | $S_{4000}$ (ppm) | $d_{31}$ (pm/V) | Sintered density (g/cm³) |
|---|---|---|---|---|---|---|---|---|---|
| Example 10 | 950 | 0.45 | 0.06 | 0.300 | 1.03 | 0.00 | 524 | 55 | 4.97 |
| Example 5 | 970 | 0.45 | 0.06 | 0.300 | 1.03 | 0.00 | 549 | 64 | 5.04 |
| Example 11 | 1000 | 0.45 | 0.06 | 0.300 | 1.03 | 0.00 | 490 | 53 | 4.99 |
| Example 12 | 1030 | 0.45 | 0.06 | 0.300 | 1.03 | 0.00 | 448 | 50 | 4.93 |
| Example 13 | 1050 | 0.45 | 0.06 | 0.300 | 1.03 | 0.00 | 432 | 48 | 4.88 |

TABLE 3

| | firing temperature (° C.) | x | y | z | a | Mn amount (parts by mole) | $S_{4000}$ (ppm) Around room temperature | $S_{4000}$ (ppm) Around $T_{OT}$ | $d_{31}$ (pm/V) | $T_{OT}$ (° C.) | $Li_3NbO_4$ amount (parts by weight) |
|---|---|---|---|---|---|---|---|---|---|---|---|
| Example 14 | 1000 | 0.45 | 0.06 | 0.300 | 1.01 | 0.00 | 351 | 502 | 42 | −22 | 0.1 to 0.5 |
| Example 15 | 970 | 0.30 | 0.06 | 0.350 | 1.03 | 0.00 | 521 | 541 | 61 | 25 | 1.0 to 1.5 |
| Example 16 | 970 | 0.70 | 0.06 | 0.250 | 1.03 | 0.00 | 517 | 515 | 63 | 61 | |
| Example 17 | 970 | 0.45 | 0.02 | 0.500 | 1.03 | 0.00 | 291 | 521 | 45 | 125 | |
| Example 18 | 970 | 0.45 | 0.08 | 0.300 | 1.03 | 0.00 | 408 | 503 | 37 | −18 | |
| Example 19 | 970 | 0.45 | 0.06 | 0.300 | 1.05 | 0.00 | 300 | 511 | 51 | 120 | 2.0 to 3.0 |
| Example 20 | 970 | 0.45 | 0.08 | 0.300 | 1.05 | 0.00 | 431 | 500 | 45 | 43 | |

TABLE 4

| | firing temperature (° C.) | x | y | z | a | Mn amount (parts by mole) | $S_{4000}$ (ppm) Around room temperature | $S_{4000}$ (ppm) Around $T_{OT}$ | $d_{31}$ (pm/V) | $T_{OT}$ (° C.) | $Li_3NbO_4$ amount (parts by weight) |
|---|---|---|---|---|---|---|---|---|---|---|---|
| Example 21 | 1000 | 0.45 | 0.05 | 0.160 | 1.01 | 0.02 | 595 | 595 | 80 | 45 | 0.1 to 0.5 |
| Example 22 | 1000 | 0.45 | 0.05 | 0.170 | 1.01 | 0.02 | 580 | 584 | 80 | 40 | |
| Example 23 | 1000 | 0.45 | 0.05 | 0.180 | 1.01 | 0.02 | 532 | 532 | 80 | 32 | |
| Example 24 | 970 | 0.45 | 0.05 | 0.170 | 1.03 | 0.02 | 405 | 534 | 58 | 100 | 1.0 to 1.5 |
| Example 25 | 970 | 0.45 | 0.05 | 0.170 | 1.05 | 0.02 | 332 | 507 | 50 | 135 | 2.0 to 3.0 |
| Comparative Example 3 | 970 | 0.45 | 0.06 | 0.080 | 1.03 | 0.02 | 261 | 472 | 48 | 138 | 1.0 to 1.5 |
| Example 26 | 970 | 0.45 | 0.06 | 0.100 | 1.03 | 0.02 | 345 | 535 | 53 | 130 | |
| Example 27 | 970 | 0.45 | 0.06 | 0.150 | 1.03 | 0.02 | 360 | 585 | 60 | 112 | |
| Example 28 | 970 | 0.45 | 0.06 | 0.200 | 1.03 | 0.02 | 339 | 601 | 58 | 85 | |
| Example 29 | 970 | 0.45 | 0.06 | 0.250 | 1.03 | 0.02 | 351 | 610 | 62 | 68 | |
| Example 30 | 970 | 0.45 | 0.06 | 0.300 | 1.03 | 0.02 | 584 | 584 | 79 | 42 | |
| Example 31 | 970 | 0.45 | 0.06 | 0.350 | 1.03 | 0.02 | 510 | 564 | 72 | 21 | |
| Example 32 | 970 | 0.45 | 0.06 | 0.400 | 1.03 | 0.02 | 431 | 536 | 61 | −13 | |
| Example 33 | 970 | 0.45 | 0.06 | 0.500 | 1.03 | 0.02 | 420 | 515 | 58 | −24 | |
| Comparative Example 4 | 970 | 0.45 | 0.06 | 0.520 | 1.03 | 0.02 | 293 | 470 | 32 | <−30 | |

TABLE 5

| | firing temperature (° C.) | x | y | z | a | Mn amount (parts by mole) | $Li_3NbO_4$ amount (parts by weight) | Sintered density (g/cm³) |
|---|---|---|---|---|---|---|---|---|
| Comparative Example 5 | 950 | 0.45 | 0.06 | 0.300 | 1.00 | 0.00 | <0.1 | 4.10 |
| Comparative Example 6 | 970 | 0.45 | 0.06 | 0.300 | 1.00 | 0.00 | | 4.15 |
| Comparative Example 7 | 1000 | 0.45 | 0.06 | 0.300 | 1.00 | 0.00 | | 4.30 |
| Comparative Example 8 | 1030 | 0.45 | 0.06 | 0.300 | 1.00 | 0.00 | | 4.40 |
| Comparative Example 9 | 1050 | 0.45 | 0.06 | 0.300 | 1.00 | 0.00 | | 4.60 |
| Example 34 | 950 | 0.45 | 0.06 | 0.300 | 1.01 | 0.00 | 0.1 to 0.5 | 4.84 |
| Example 35 | 970 | 0.45 | 0.06 | 0.300 | 1.01 | 0.00 | | 4.95 |
| Example 14 | 1000 | 0.45 | 0.06 | 0.300 | 1.01 | 0.00 | | 4.98 |
| Example 36 | 1030 | 0.45 | 0.06 | 0.300 | 1.01 | 0.00 | | 4.96 |
| Example 37 | 1050 | 0.45 | 0.06 | 0.300 | 1.01 | 0.00 | | 4.95 |
| Example 10 | 950 | 0.45 | 0.06 | 0.300 | 1.03 | 0.00 | 1.0 to 1.5 | 4.97 |
| Example 5 | 970 | 0.45 | 0.06 | 0.300 | 1.03 | 0.00 | | 5.04 |
| Example 11 | 1000 | 0.45 | 0.06 | 0.300 | 1.03 | 0.00 | | 4.99 |
| Example 12 | 1030 | 0.45 | 0.06 | 0.300 | 1.03 | 0.00 | | 4.93 |
| Example 13 | 1050 | 0.45 | 0.06 | 0.300 | 1.03 | 0.00 | | 4.88 |
| Example 38 | 950 | 0.45 | 0.06 | 0.300 | 1.05 | 0.00 | 2.0 to 3.0 | 5.02 |
| Example 20 | 970 | 0.45 | 0.06 | 0.300 | 1.05 | 0.00 | | 5.03 |
| Example 39 | 1000 | 0.45 | 0.06 | 0.300 | 1.05 | 0.00 | | 4.99 |
| Example 40 | 950 | 0.45 | 0.06 | 0.300 | 1.06 | 0.00 | 3.0< | 5.01 |
| Example 41 | 970 | 0.45 | 0.06 | 0.300 | 1.06 | 0.00 | | 5.00 |
| Example 42 | 1000 | 0.45 | 0.06 | 0.300 | 1.06 | 0.00 | | 4.97 |

Successively, an alcohol as a dispersion medium was added to the starting materials and mixed for 16 hours by a ball mill. Further successively, after the obtained starting material mixtures were dried, the starting material mixtures were calcined at 800° C. for 5 hours and pulverized by a ball mill repeatedly twice to obtain ceramics powders of the piezoelectric/electrostrictive ceramic compositions. In this case, with respect to Examples 8, 9, 21 to 33 and Comparative Examples 3 and 4, $MnO_2$ in the addition amounts shown in Table 1 to Table 5 was added to the ceramics powders.

Next, after the ceramics powders were coarsely pulverized, the powders were sieved by a 500 mesh-sieve of to adjust the particle size.

The ceramics powders obtained in such a manner were compacted into a circular disc with a diameter of 18 mm and a thickness of 5 mm by a pressure of $2.0 \times 10^8$ Pa. Thereafter, each compacted body was housed in an aluminum container and fired at 950 to 1050° C. for 3 hours to obtain a sintered body (piezoelectric/electrostrictive body).

Successively, each sintered body was processed into a rectangular shape of 12 mm in longer side×3 mm in shorter side×1 mm in thickness and thermally treated at 600 to 900° C. Thereafter, a gold electrode was formed by sputtering on both main faces of each rectangular sample. Thereafter, the sample was immersed in silicon oil and a voltage of 5 kV/mm was applied to the gold electrodes in both main faces for 15 minutes to carry out polarization treatment in the thickness direction.

Examples 1 to 9 and Comparative Examples 1 and 2

{Electric Properties and Temperature Properties}

Using the piezoelectric/electrostrictive devices for evaluation of Examples 1 to 9 and Comparative Examples 1 and 2 subjected to firing at 970° C., the piezoelectric constant $d_{31}$ (pm/V) and the strain ratios $S_{4000}$ (ppm) around room temperature and the phase transition temperature $T_{OT}$ were measured. The measurement results are shown in Table 1. The piezoelectric constant $d_{31}$ was measured by measuring the frequency-impedance characteristic of each piezoelectric/electrostrictive device and electrostatic capacity by an impedance analyzer and at the same time the size of the piezoelectric/electrostrictive device by a micrometer and carrying out calculation from the resonance frequency of the basic wave of the vibration expanding in the longitudinal direction and the antiresonance frequency, the electrostatic capacity, and the size. The strain ratio $S_{4000}$ was obtained by measuring electric field-induced strain in the longitudinal direction by a strain gauge stuck to the electrodes by an adhesive when a voltage of 4 kV/mm was applied to the gold electrode on both main faces. A measurement method of the phase transition temperature $T_{OT}$ will be described later.

As being made clear by referring to Table 1 and comparing Examples 1 to 7 with Comparative Examples 1 and 2, within a range of a Ta amount of $0.1 \leq z \leq 0.5$, a good strain ratio $S_{4000}$ can be obtained in a composition defined by the general formula; $\{Li_{0.06}(Na_{0.55}K_{0.45})_{0.94}\}_{1.03}(Nb_{1-z}Ta_z)O_3$. If the Ta amount is below or exceeds the range, it became impossible to obtain a good strain ratio $S_{4000}$. Further, as being made clear by referring to Examples 8 and 9, the strain ratio $S_{4000}$ can be improved more by adding the Mn compound in an amount of 0.02 or 0.10 parts by mole (0.02 or 0.10 parts by mole in terms of Mn atoms) to 100 parts by mole of the main component defined by the composition formula; $\{Li_{0.06}(Na_{0.55}K_{0.45})_{0.94}\}_{1.03}(Nb_{0.70}Ta_{0.30})O_3$.

{X-Ray Diffraction Pattern}

Figure 8:
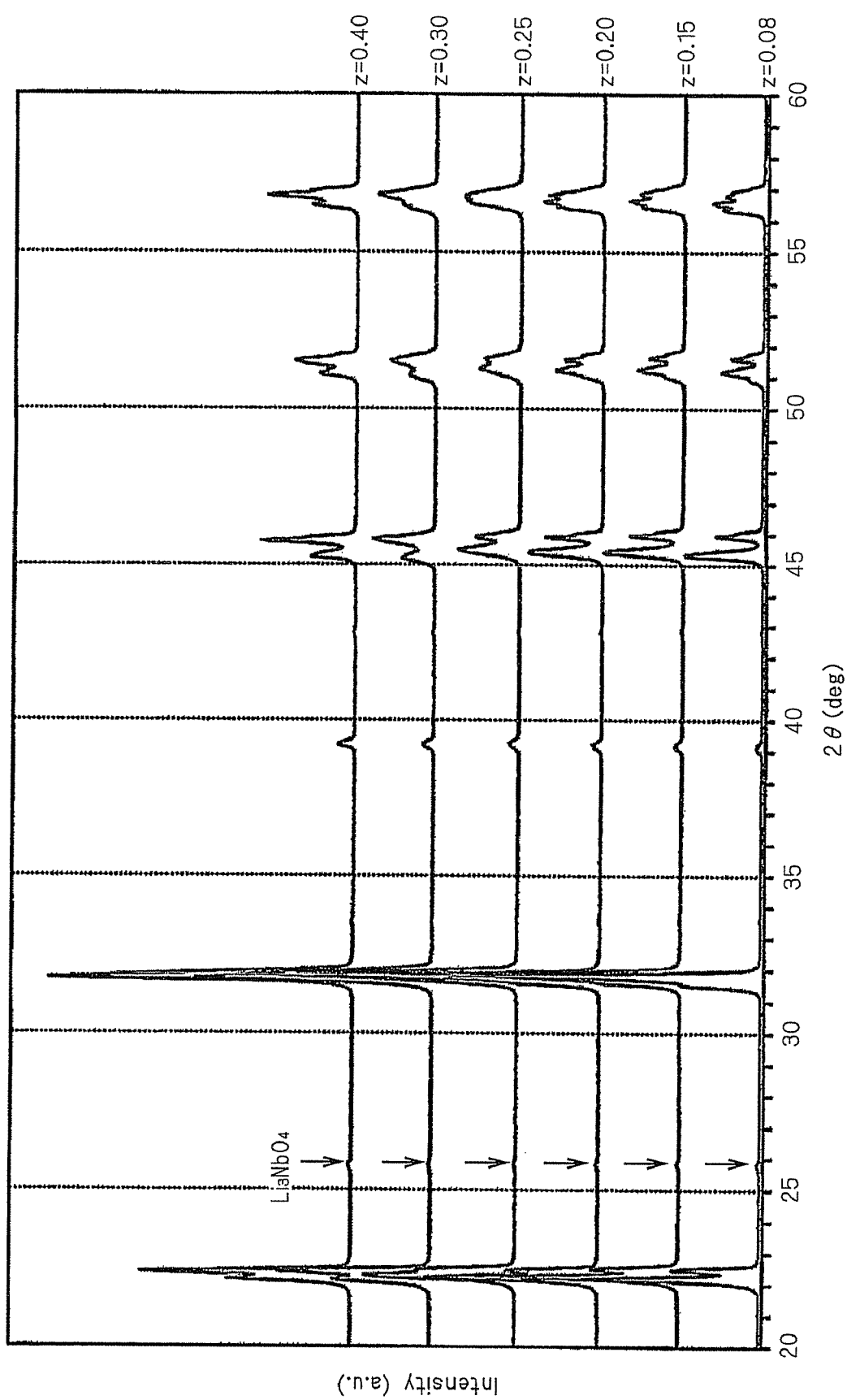
FIG. 8 is a graph showing an X-ray diffraction pattern of a sintered body.

FIG. 8 shows X-ray (CuKα-beam) diffraction patterns of sintered bodies used for piezoelectric/electrostrictive devices of Examples 2 to 6 in which the Ta amount z satisfy z=0.15, 0.20, 0.25, 0.30, or 0.40. In addition, FIG. 8 also shows the X-ray diffraction pattern of a sintered body having a Ta amount satisfying z=0.08.

At the time of X-ray diffraction pattern measurement, each sample was set in a manner that an X-ray could be irradiated to the surface having an area of 12 mm×3 mm of the processed sample and the X-ray diffraction pattern of each sample was measured by a 2θ/θ method within a range of 20° to 60°. The X-ray diffraction pattern was measured by using an X-ray diffractmetor and a CuKα-beam as an irradiation source and installing a graphite monochrometer in front of a detector. The measurement was carried out after setting the X-ray generation condition to 35 kV-30 mA, a scanning width of 0.02°, a scanning speed of 2°/minute, a diffusion slit of 1°, and a light reception slit of 0.3 mm.

As shown in FIG. 8, in the case the Ta amount was z=0.15, 0.20, or 0.25, X-ray diffraction patterns peculiar to the orthorhombic system of perovskite was observed and it can be understood that the crystal system of the sintered bodies was the orthorhombic system. On the other hand, in the case the Ta amount was z=0.30 or 0.40, X-ray diffraction patterns peculiar to the tetragonal system of perovskite was observed and it can be understood that the crystal system of the sintered bodies was the tetragonal system.

Further, as shown in FIG. 8, in the X-ray diffraction patterns of the sintered bodies used for the piezoelectric/electrostrictive devices of Examples 2 to 6, peaks derived from the hetero-phase shown by the arrows were observed. This hetero-phase was supposed to be $Li_3NbO_4$.

Furthermore, from the X-ray diffraction patterns of the sintered bodies used for piezoelectric/electrostrictive devices of Examples 1 to 9 and Comparative Examples 1 and 2, the $Li_3NbO_4$ amount was quantitatively measured. The $Li_3NbO_4$ amount was calculated from the ratio of the integrated intensity of the diffraction peak of (211) plane of $Li_3NbO_4$ in the X-ray diffraction pattern of the sintered body to the total of the integrated intensities of the diffraction peaks of (101) plane and (110) plane of the perovskite. The quantitative analysis results are shown in Table 1. The $Li_3NbO_4$ amounts shown in Table 1 are the weight ratios to 100 parts by mole of the perovskite type oxide. As shown in Table 1, the $Li_3NbO_4$ amounts of Examples 1 to 9 and Comparative Examples 1 and 2 were within a range of 1.0 to 1.5 parts by weight and in Examples 1 to 9 having desirable compositions, good strain ratios $S_{4000}$ were obtained at a firing temperature of 970° C.

{Phase Transition Temperature $T_{OT}$}

Next, the phase transition temperature $T_{OT}$ of each sintered body used for Examples 1 to 9 and Comparative Examples 1 and 2 was measured. The phase transition temperature $T_{OT}$ was obtained by measuring the temperature-dependency of a specific dielectric constant $\in/\in_0$ by an impedance analyzer. The measurement results are shown in Table 1. As being made clear from the measurement results, as the Ta amount was increased, the phase transition temperature $T_{OT}$ was lowered and if the Ta amount is within a range of $0.1 \leq z \leq 0.5$, the phase transition temperature $T_{OT}$ is within a practically usable temperature range and as a result, the strain ratio $S_{4000}$ at room temperature also exceeds 250 ppm. However, if the Ta amount is below the range, the phase transition temperature $T_{OT}$ is not lowered sufficiently, and as a result, it becomes impossible to obtain a good strain ratio $S_{4000}$ at room temperature and if the Ta amount exceeds the range, the phase transition temperature $T_{OT}$ is considerably lowered and as a result, it becomes impossible to obtain a good strain ratio $S_{4000}$ at room temperature and near the phase transition temperature $T_{OT}$.

Examples 5 and 10 to 13

Using piezoelectric/electrostrictive devices for evaluation of Examples 5 and 10 to 13 firing at 950, 970, 1000, 1030, or 1050° C., the piezoelectric constant $d_{31}$ (pm/V), the stain ratio $S_{4000}$ (ppm), and the sintered density (g/cm$^3$) were measured at room temperature. The measurement results are shown in Table 2. The measurement methods of the piezoelectric constant $d_{31}$ and the stain ratio $S_{4000}$ were the same as the above-mentioned measurement methods. The sintered density was measured by an Archimedes method.

As being made clear by referring to Table 2 and comparing Examples 5 and 10 to 13, if the firing temperature is within a range of 950 to 1050° C., the strain ratios $S_{4000}$ and sintering densities sufficient for practical use can be obtained in all cases and the strain ratio $S_{4000}$ and the sintered density become the maximum at 970° C. That is, with respect to the piezoelectric/electrostrictive ceramic compositions of Examples 5 and 10 to 13, although the Ta amount was z=0.3, the sintering property was good.

Examples 14 to 20

Next, using piezoelectric/electrostrictive devices for evaluation of Examples 14 to 20 in which the main component compositions were variously changed without adding MnO$_2$, the piezoelectric constant $d_{31}$ (pm/V), the stain ratios $S_{4000}$ (ppm) at room temperature and near the phase transition temperature $T_{OT}$ and the phase transition temperature $T_{OT}$ (° C.) were measured. The measurement results are shown in Table 3. The measurement methods of the piezoelectric constant $d_{31}$ and the stain ratios $S_{4000}$ were the same as the above-mentioned measurement methods. Further, from the X-ray diffraction patterns of the sintered bodies employed for the piezoelectric/electrostrictive devices of Examples 14 to 20, the $Li_3NbO_4$ amount was quantitatively measured. The quantitative measurement results are shown in Table 3. The quantitative measurement method of the $Li_3NbO_4$ amount was the same as the above-mentioned quantitative measurement method.

As shown in Table 3, even if the main component compositions are changed in the above-mentioned manner, in the case the Ta amount is within the range of $0.1 \leq z \leq 0.5$, the phase transition temperature $T_{OT}$ is within a range for practical use and a good strain ratio $S_{4000}$ can be obtained.

Furthermore, in Examples 14 to 20, the $Li_3NbO_4$ amount was within a range of 0.1 to 0.5 parts by weight (Example 14) within a range of 1.0 to 1.5 parts by weight (Examples 15 to 18), and within a range of 2.0 to 3.0 parts by weight (Examples 19 and 20), and good strain ratios $S_{4000}$ were obtained by firing at a firing temperature of 970 to 1000° C.

Examples 21 to 33 and Comparative Examples 3 and 4

Next, using piezoelectric/electrostrictive devices for evaluation of Examples 21 to 33 and Comparative Examples 3 and 4 in which the main component compositions were variously changed and a Mn compound in an amount of 0.02 parts by mole (0.02 parts by mole in terms of Mn atoms), the piezoelectric constant $d_{31}$ (pm/V), the stain ratios $S_{4000}$ (ppm) at room temperature and near the phase transition temperature $T_{OT}$, and the phase transition temperature $T_{OT}$ (° C.) were measured. The measurement results are shown in Table 4. The measurement methods of the piezoelectric constant $d_{31}$ and the stain ratios $S_{4000}$ were the same as the above-mentioned measurement methods. Further, from the X-ray diffraction patterns of the sintered bodies employed for the piezoelectric/electrostrictive devices of Examples 21 to 33 and Comparative Examples 3 and 4, the $Li_3NbO_4$ amount was quantitatively measured. The quantitative measurement results are shown in Table 4. The quantitative measurement method of the $Li_3NbO_4$ amount was the same as the above-mentioned quantitative measurement method.

As shown in Table 4, even if the main component compositions are changed in the above-mentioned manner in the case the Mn compound is added, if the Ta amount is within the range of $0.1 \leq z \leq 0.5$, the phase transition temperature $T_{OT}$ is within a range for practical use and a good strain ratio $S_{4000}$ can be obtained.

Further, as being made clear by comparison of Examples 1 to 7 and Examples 26 to 33, addition of the Mn compound can improve the strain ratio $S_{4000}$.

Furthermore, in Examples 21 to 33 and Comparative Examples 3 and 4, as shown in Table 4, the $Li_3NbO_4$ amount was within a range of 0.1 to 0.5 parts by weight (Examples 21 to 23), within a range of 1.0 to 1.5 parts by weight (Examples 24 and 26 to 33 and Comparative Examples 3 and 4), and within a range of 2.0 to 3.0 parts by weight (Example 25), and in Examples 21 to 33 having desirable compositions, good strain ratios $S_{4000}$ were obtained by firing at a firing temperature of 970 to 1000° C.

Examples 5, 10 to 14, 20, and 34 to 42 and Comparative Examples 5 to 9

Next, the sintered density of the sintered bodies used for the piezoelectric/electrostrictive devices of (a) Comparative Examples 5 to 9, (b) Examples 14 and 34 to 37, (c) Examples 5 and 10 to 13, (d) Examples 20, 38, and 39, and (e) Examples 40 to 42 in which the firing temperature was changed while the main component composition was kept constant was measured and the $Li_3NbO_4$ amount was quantitatively measured from the X-ray diffraction pattern of each sintered body. The measurement results and quantitative measurement results are shown in Table 5. The measurement method of the sintered density and the quantitative measurement method of the $Li_3NbO_4$ amount were the same as the above-mentioned measurement method and quantitative measurement method.

As shown in Table 5, in Comparative Examples 5 to 9, the $Li_3NbO_4$ amount was less than 0.1 parts by weight and even if the firing temperature was increased to 1050° C., the sintered density was not saturated and thus it can not be said that even if the firing temperature is increased to 1050° C., sintering can be promoted sufficiently. Whereas, in Examples 5, 10 to 14, 20, and 34 to 42, the $Li_3NbO_4$ amount was within a range of 0.1 to 0.5 parts by weight (Examples 14 and 34 to 37), within a range of 1.0 to 1.5 parts by weight (Examples 5 and 10 to 13), within a range of 2.0 to 3.0 parts by weight (Examples 20, 38, and 39), and exceeding 3 parts by weight (Examples 40 to 42) and the sintered density was saturated at a firing temperature of 1050° C. or lower and thus sintering was sufficiently promoted at a firing temperature of 1050° C. or lower. However, in Examples 40 to 42 in which the $Li_3NbO_4$ amount was more than 3 parts by weight, short circuit due to insulation breakdown tended to be caused easily in polarization treatment or operation.

While the invention has been shown and described in detail, the foregoing description is in all aspects illustrative and not restrictive. It is therefore understood that numerous modifications and variations can be devised without departing from the scope of the invention.

What is claimed is:

1. A piezoelectric/electrostrictive ceramic composition having a composition wherein Li, Na, and K are contained as first elements; Nb and Ta are contained as second elements; O is contained as a third element; a ratio of the total number of atoms of said first elements to the total number of atoms of said second elements is higher than 1; and the ratio of the number of Ta atoms to the total number of atoms of said second elements is between 30 mol % or more and 50 mol % or less as a whole, said composition (1) comprising a perovskite type oxide wherein said first elements are A site composing elements and said second elements are B site composing elements, and (2) being represented by the general formula $\{Li_y(Na_{1-x}K_x)_{1-y}\}_a(Nb_{1-z}Ta_z)O_3$ wherein a, x, y and z respectively satisfy $1 < a \leq 1.05$, $0.30 \leq x \leq 0.70$, $0.02 \leq y \leq 0.10$ and $0.3 \leq z \leq 0.5$.

2. A piezoelectric/electrostrictive device, comprising:
a piezoelectric/electrostrictive film, which is a sintered body of a piezoelectric/electrostrictive ceramic composition; and
electrode films on both main faces of said piezoelectric/electrostrictive film,
wherein said piezoelectric/electrostrictive ceramic composition has a composition wherein Li, Na, and K are contained as first elements; Nb and Ta are contained as second elements; O is contained as a third element; a ratio of the total number of atoms of said first elements to the total number of atoms of said second elements is higher than 1; and the ratio of the number of Ta atoms to the total number of atoms of said second elements is between 30 mol % or more and 50 mol % or less as a whole, said composition (1) comprising a perovskite type oxide wherein said first elements are A site composing elements and said second elements are B site composing elements, and (2) being represented by the general formula $\{Li_y(Na_{1-x}K_x)_{1-y}\}_a(Nb_{1-z}Ta_z)O_3$ wherein a, x, y and z respectively satisfy $1<a\leqq1.05$, $0.30\leqq x\leqq0.70$, $0.02\leqq y\leqq0.10$ and $0.3\leqq z\leqq0.5$.

* * * * *